(12) United States Patent
Xiaochun et al.

(10) Patent No.: US 7,095,113 B2
(45) Date of Patent: Aug. 22, 2006

(54) SEMICONDUCTOR DEVICE WITH INTERLOCKING CLIP

(75) Inventors: Tan Xiaochun, Shanghai (CN); Shi Jingping, Shanghai (CN)

(73) Assignee: Diodes Incorporated, Westlake Village, CA (US)

( * ) Notice: Subject to any disclaimer, the term of this patent is extended or adjusted under 35 U.S.C. 154(b) by 0 days.

(21) Appl. No.: 11/048,461

(22) Filed: Jan. 31, 2005

(65) Prior Publication Data

US 2005/0199985 A1    Sep. 15, 2005

Related U.S. Application Data

(60) Provisional application No. 60/539,930, filed on Jan. 29, 2004.

(51) Int. Cl.
  H01L 23/34 (2006.01)
  H01L 23/02 (2006.01)
  H02B 11/00 (2006.01)

(52) U.S. Cl. .................. 257/725; 257/726; 257/727; 257/678; 361/607; 361/609; 361/615; 361/732; 361/759

(58) Field of Classification Search ........ 257/725–727, 257/678; 361/192, 193, 607, 609, 615, 732, 361/759
See application file for complete search history.

(56) References Cited

U.S. PATENT DOCUMENTS

| 4,803,545 A | * | 2/1989 | Birkle ..................... 257/718 |
| 5,350,713 A | * | 9/1994 | Liang ..................... 438/106 |
| 5,834,842 A | * | 11/1998 | Majumdar et al. .......... 257/718 |
| 6,351,034 B1 | * | 2/2002 | Farnworth et al. .......... 257/727 |
| 6,396,127 B1 | * | 5/2002 | Munoz et al. ............. 257/666 |
| 6,587,344 B1 | * | 7/2003 | Ross ..................... 361/704 |

* cited by examiner

*Primary Examiner*—Jasmine Clark
(74) *Attorney, Agent, or Firm*—Courtney Staniford & Gregory LLP (57) ABSTRACT

A semiconductor device is provided having a single-piece clip that interlocks into a lead frame using one or more forks on the clip that mate with one or more corresponding slots in the lead frame. A semiconductor die is mounted to a pad of the lead frame and the clip couples the die to a conductive lead of the lead frame. The interlocking coupling forms a lever that allows adjustment of a position of the clip relative to a region of the semiconductor die. Interference between the clip fork and a slot corresponding to the clip fork confines the lever motion or pivoting of the clip relative to the mounted semiconductor die. The coupling between the clip fork and the slot furthermore confines motion of the clip in each of a first dimension and a second dimension relative to a position of the lead frame.

14 Claims, 8 Drawing Sheets

SEMICONDUCTOR DEVICE WITH INTERLOCKING CLIP

RELATED APPLICATION

This application claims the benefit of U.S. Patent Application No. 60/539,930, filed on Jan. 29, 2004.

TECHNICAL FIELD

The present invention relates generally to the field of semiconductor devices and, more particularly, to devices using a single-piece clip that couples a lead frame to a die.

BACKGROUND

Figure 11:
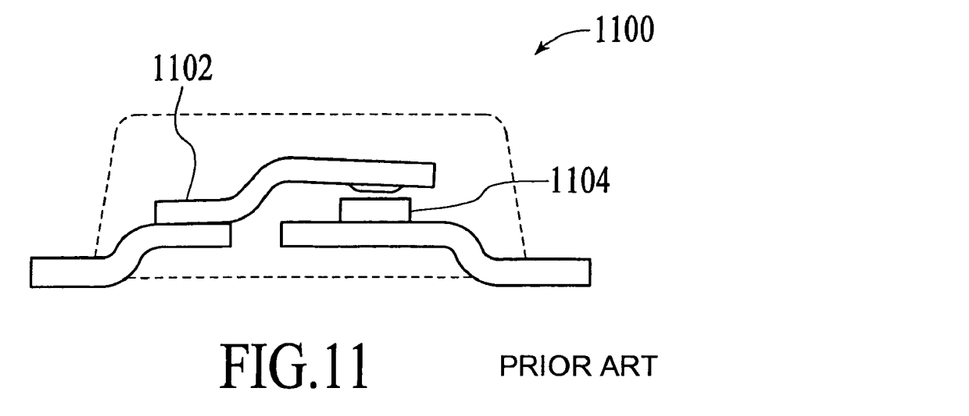
FIG. 11 is a side view of a semiconductor package that uses a one-piece clip to connect to the semiconductor die, under the prior art.
Figure 12:
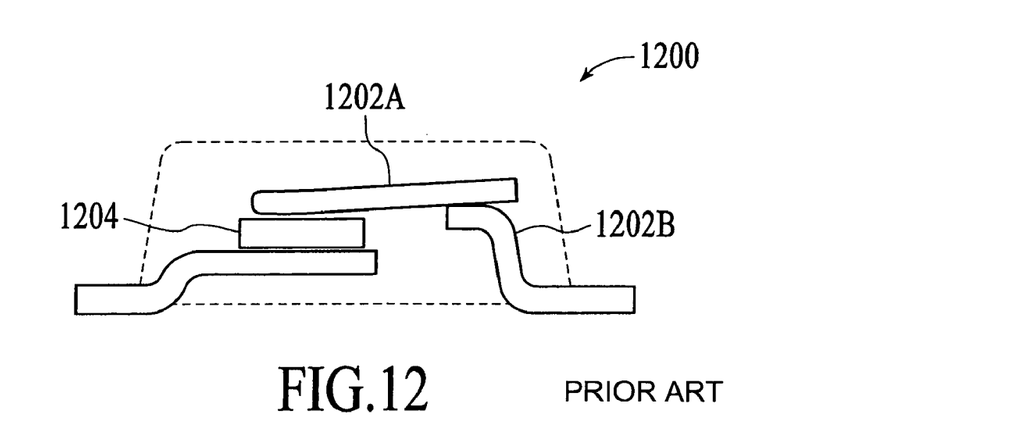
FIG. 12 is a side view of a semiconductor package that includes a two-piece clip for connecting to the semiconductor die, under the prior art.
Figure 13:
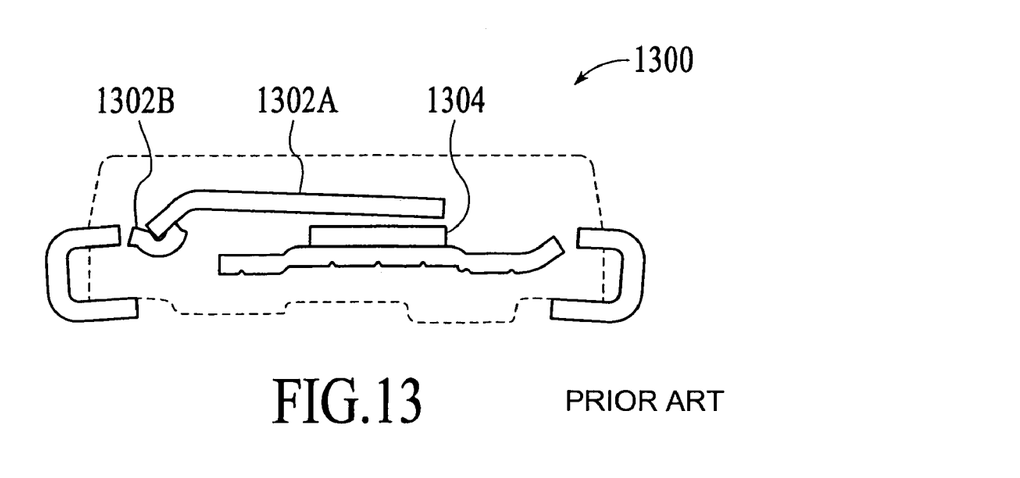
FIG. 13 is a side view of another semiconductor package that uses a two-piece clip to connect to the semiconductor die, under the prior art.

Integrated circuit ("IC") die or "die" are typically mounted in or on a package in order to form a semiconductor device, also referred to as a "semiconductor device package", a "semiconductor chip package", a "semiconductor package" or an "IC device package". Mounting of an IC die to a package facilitates subsequent attachment of the resulting semiconductor device to a printed circuit board ("PCB") or other component of an electronic assembly. Typical non-wirebonded two-terminal surface-mount discrete power semiconductor devices consist of a lead frame on which the bottom side of a semiconductor die or chip is mounted, and either a one-piece or a two-piece clip that makes a connection to the top side of a semiconductor die. FIG. 11 is a side view of a semiconductor package 1100 that uses a one-piece clip 1102 to connect to the semiconductor die 1104, under the prior art. FIG. 12 is a side view of a semiconductor package 1200 that includes a two-piece clip 1202A/1202B for connecting to the semiconductor die 1204, under the prior art. FIG. 13 is a side view of another semiconductor package 1300 that uses a two-piece clip 1302A/1302B to connect to the semiconductor die 1304, under the prior art.

The semiconductor package that uses the two-piece clip has an advantage in that the joint between the top and bottom pieces that form the clip allows the clip to "float" on the semiconductor die. The clip floating means the joint between the pieces of the clip acts as a lever point that enables adjustments to the position of the clip relative to the top side of the semiconductor die, thereby ensuring proper connection of the clip to the top side.

However, the joint between the top and bottom pieces of the two-piece clip increases the difficulty and cost of manufacturing the semiconductor package and reduces the units per hour ("UPH") rate in assembly. Further, the joint between the top and bottom pieces of the clip necessitates an extra solder joint, and the solder joint is a point where the connection to the semiconductor die may be lost as a result of poor process control in the solder dispensing or reflow operations. Additionally, centering of the clip on the top side of the semiconductor die becomes constrained by the process control capability over both the clip and the semiconductor die.

The semiconductor package that uses the one-piece clip has an advantage in that elimination of the joint between the top and bottom pieces that form the two-piece clip reduces the cost of manufacturing, increases the UPH rate, and reduces the chances of having an open circuit in the path to the semiconductor die top side. Use of the one-piece clip realizes another advantage in that x-dimension control over centering of the clip on the semiconductor die top side depends primarily on placement control of the semiconductor die on the lead frame.

However, use of the one-piece clip can also introduce problems in manufacturing in the absence of adequate process control to ensure that the distance between the top side of the semiconductor die and the contact portion of the clip that contacts the top side does not exceed the maximum distance across which solder can make the specified connection. There exists a possibility that, when the manufacturing process control allows this maximum distance to become excessive, the solder will not wet to the clip and consequently only a mechanical compression contact is formed between the contact portion of the clip and the top side. The mechanical compression contact is unreliable because it can subsequently result in intermittent electrical contact with the semiconductor die top side or an open electrical circuit. Therefore, use of the one-piece clip can necessitate higher manufacturing tolerances in the areas of bow angle and skew on the clip during manufacture of the semiconductor packages.

BRIEF DESCRIPTION OF THE FIGURES

In the drawings, the same reference numbers identify identical or substantially similar elements or acts.

DETAILED DESCRIPTION

A semiconductor device or "device" is provided that includes a lead frame, a semiconductor die, and a single-piece clip. The single-piece clip includes forks that interlock into the lead frame through mating with slots in the lead frame. The single-piece clip that interlocks with the lead frame allows the clip to act as a lever that enables adjustments to the position of the clip relative to the top side of the semiconductor die during manufacturing, thereby ensuring proper connection of the clip to the top side of the semiconductor die. Furthermore, the single-piece clip reduces the cost of manufacturing, increases the UPH rate, and reduces/eliminates chances of having an open circuit in the path to the semiconductor chip top side by eliminating the joint(s) between multiple pieces that form multi-piece clips. Moreover, the interlocking single-piece clip can relax the tolerances relating to placement of the clip onto the semiconductor die during manufacturing.

The following description provides specific details for a thorough understanding of, and enabling description for, embodiments of a semiconductor device having an interlocking clip. However, one skilled in the art will understand that the semiconductor device with interlocking clip described herein may be practiced without these details. In other instances, well-known structures and functions have not been shown or described in detail to avoid unnecessarily obscuring the description of the embodiments of the semiconductor device with interlocking clip.

Figure 1:
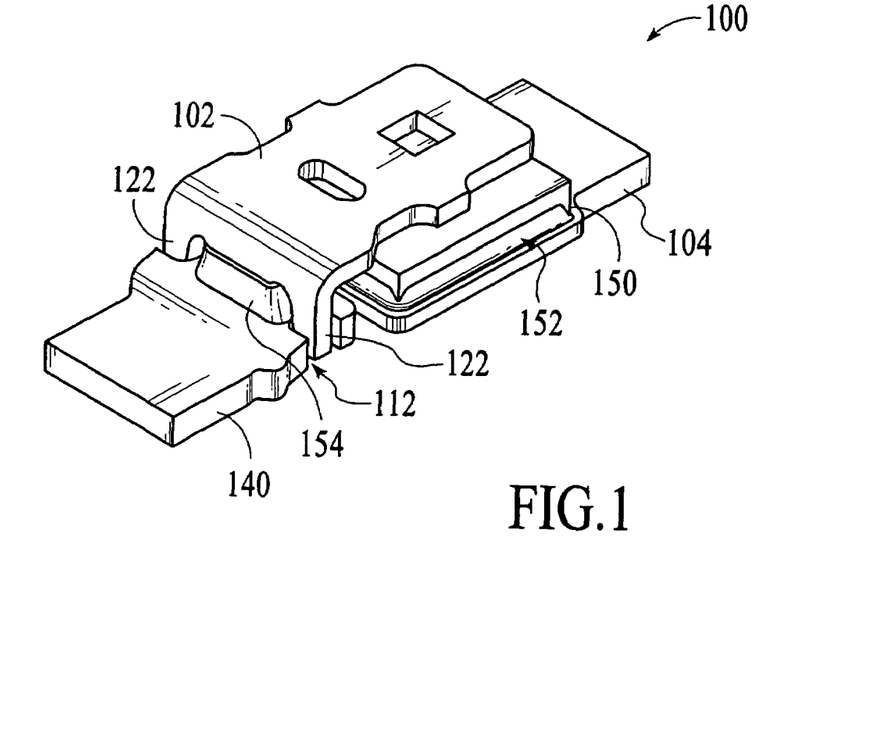
FIG. 1 is a perspective view of a semiconductor device having a single-piece interlocking clip, under an embodiment.

FIG. 1 is a perspective view of a semiconductor device 100 having a single-piece interlocking clip, under an embodiment. The single-piece interlocking clip is also referred to herein as a "clip" but is not so limited. The semiconductor device 100 includes a single-piece clip 102 that interlocks into the lead frame 140 using one or more forks 122 on the clip 102 that mate with one or more corresponding slots in the lead frame 140. A semiconductor die 150 is mounted to a pad of the lead frame 104 and the single-piece clip 102 couples a conduction region of the die 150 to a conductive lead 140 of the lead frame. The interlocking coupling between the clip 102 and the lead frame 140 forms a lever that allows adjustment of a position of the clip 102 relative to a region of the semiconductor die 150. Interference between the clip forks 122 and slots 112 corresponding to the clip forks 122 confines the lever motion or pivoting of the clip 102 relative to the mounted semiconductor die 150. The coupling between the clip forks 122 and the slots 112 furthermore confines motion of the clip 102 in each of a first dimension and a second dimension relative to a position of the lead frame 104.

Figure 2:
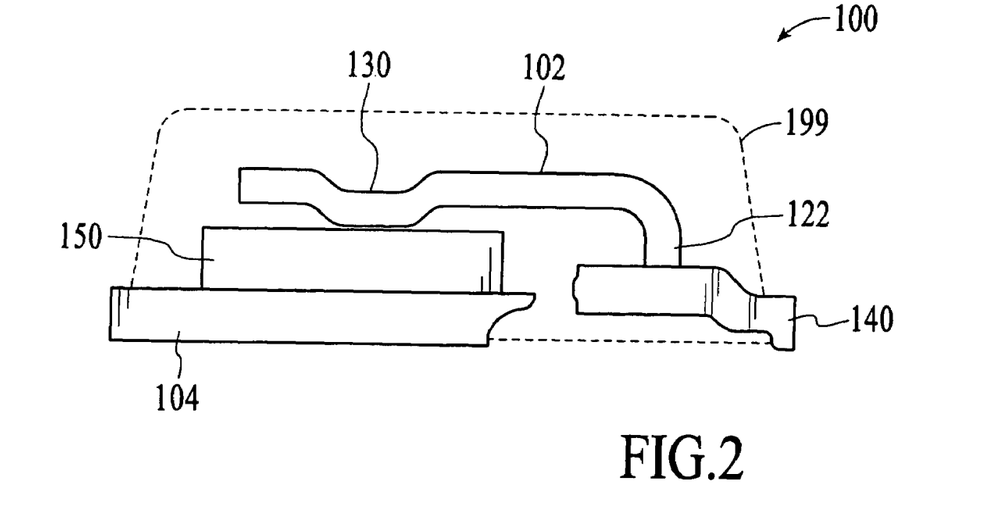
FIG. 2 is a side view of the semiconductor device including the single-piece interlocking clip, under the embodiment of FIG. 1.

FIG. 2 is a side view of the semiconductor assembly 100 including the single-piece interlocking clip, under the embodiment of FIG. 1. The semiconductor device 100 includes a semiconductor die 150 coupled to a conductive mounting platform or pad of a lead frame 104. The coupling of the semiconductor die 150 to the lead frame 104 uses at least one material that includes solder 152, for example, but may use other materials as appropriate to the materials comprising the die 150 and the lead frame 104. A conductive lead of the lead frame 140 is coupled to a portion of the semiconductor die 150, for example the top side, using at least one clip 102. The clip 102 of an embodiment includes two forks 122 that are mechanically coupled to corresponding slots 112 in the lead frame 140, as described below. Solder 154 may also used in the coupling between the clip 102 and the lead frame 140, but the embodiment is not so limited, and other materials may be used as appropriate to the materials comprising one or more of the clip 102, the lead frame 104, and the die 150. The combination of the conductive lead 140, the clip 102, which includes conductive material, and the solder 154 forms an electrically conductive path between the conductive lead 140 and the semiconductor die 150, but the embodiment is not so limited. A packaging or other enclosure 199 is formed around the semiconductor device, but the embodiment is not so limited.

Figure 3:
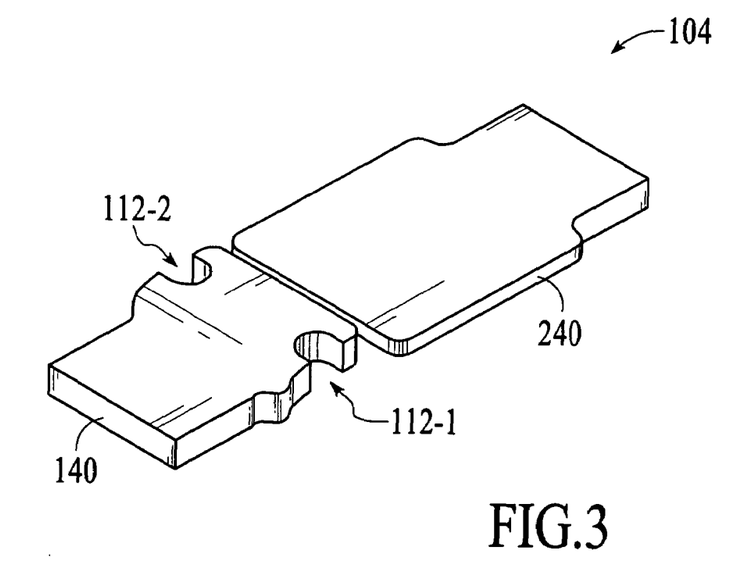
FIG. 3 is a perspective view of a lead frame of the semiconductor assembly, under the embodiment of FIG. 1.

FIG. 3 is a perspective view of a lead frame 104 of a semiconductor assembly, under the embodiment of FIG. 1. The lead frame 104 includes a conductive mounting platform 240 or pad 240, and the conductive mounting platform is configured to receive a die (not shown). The lead frame also includes a conductive lead that includes slots 112 configured to receive a portion of the clip (not shown). The slots 112 of an embodiment include a first slot 112-1 in a first surface of the lead frame and a second slot 112-2 in a second surface of the lead frame. The first surface and the first slot 112-1 very nearly oppose the second surface and second slot 112-2, but are not so limited.

Alternative embodiments of the lead frame may include any number of slots in the first surface and any number of slots in the second surface. Likewise, alternative embodiments of the lead frame may position slots of the first surface in any position relative to a position of slots of the second surface.

Figure 4:
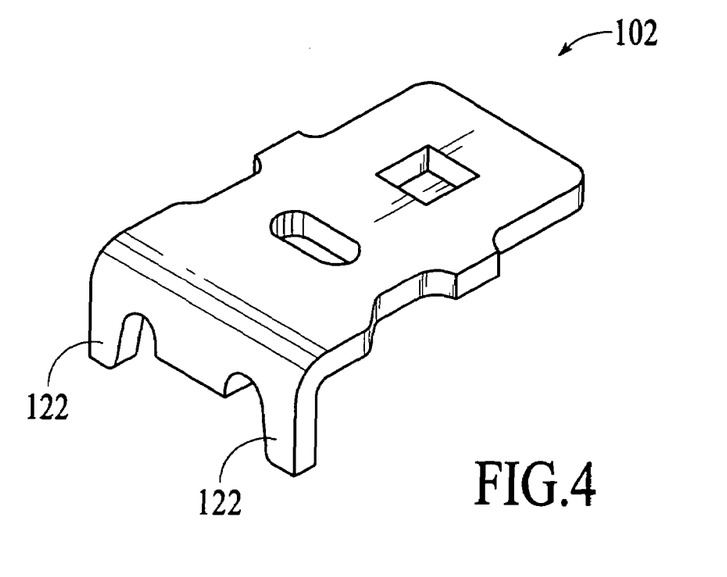
FIG. 4 is a perspective view of the single-piece interlocking clip, under the embodiment of FIG. 1.

FIG. 4 is a perspective view of the single-piece interlocking clip 102, under the embodiment of FIG. 1. The clip 102 includes two forks 122 as described above. However, alternative embodiments may include a different number of forks. Each fork of the clip (also referred to as a "clip fork") has at least one dimension that tapers relative to a distance from an end of the clip fork that couples to the slot, but is not so limited.

Figure 5:
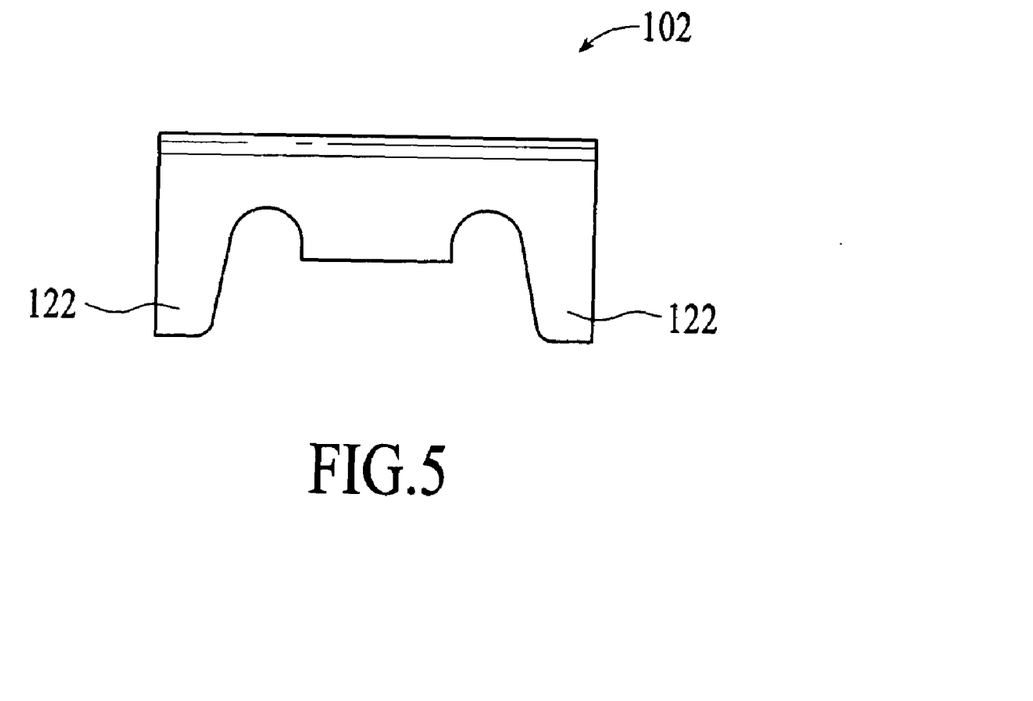
FIG. 5 is a side view (y-axis) of the interlocking clip, under the embodiment of FIG. 1.
Figure 6:
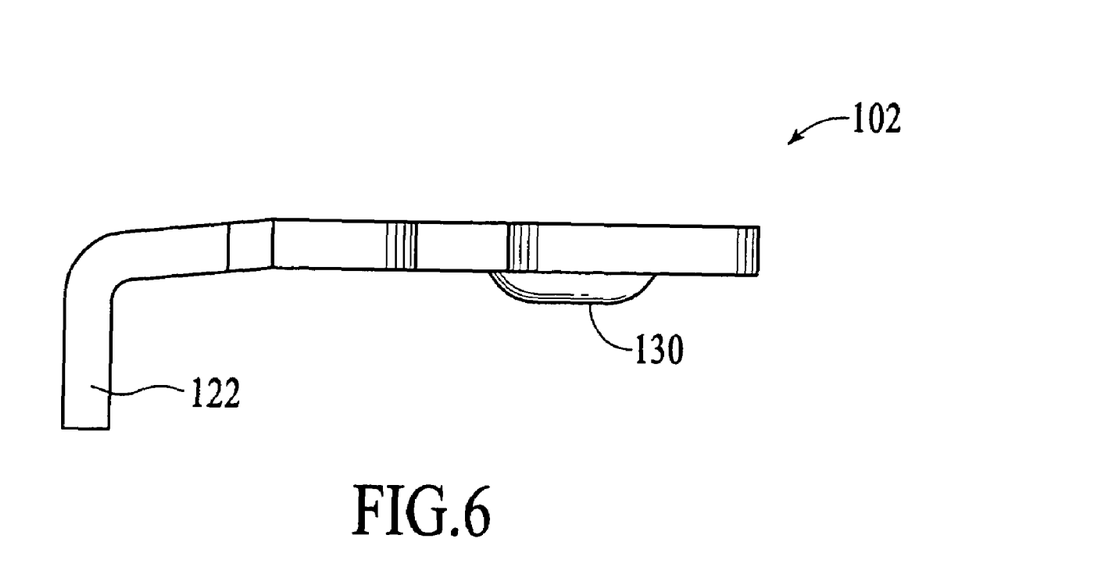
FIG. 6 is a side view (x-axis) of the interlocking clip, under the embodiment of FIG. 1.

FIG. 5 is a side view (y-axis) of the single-piece interlocking clip 102, under the embodiment of FIG. 1. FIG. 6 is a side view (x-axis) of the single-piece interlocking clip 102, under the embodiment of FIG. 1. The clip 102 of an embodiment includes a first region 130 that couples to one or more conducting regions or areas of the semiconductor die (not shown). A second region of the clip 102 includes the clip forks 122. The first region 130 of the clip 102 has an orientation that is approximately normal to the orientation of the clip forks 122, but alternative embodiments may have orientations as appropriate to the size and configuration of at least one of the clip 102, the die (not shown), and the lead frame (not shown).

With reference to FIGS. 3, 4, 5, and 6, the clip 102 of an embodiment includes two forks 122 and the lead frame 104 of an embodiment includes two slots 112. The forks 122 are also referred to herein as clip forks 122, and the slots 112 are also referred to herein as lead frame slots 112. Alternative embodiments can include other numbers and/or combinations of clip forks and lead frame slots. Each lead frame slot 112 is configured to receive a clip fork 122. Each clip fork 122 is configured to have an increasing width as the clip fork 122 transitions from an end that mates with a lead frame slot 112 to a top portion of the clip 102, but alternative embodiments can have different fork dimensions and shapes. The combination of the clip forks 122 and the lead frame slots 112 forms an interlock coupling that constrains the x- and y-dimension displacement or motion of the clip 102 and ensures consistent x- and y-dimension control over placement of the clip 102.

Further, the interference of the clip forks 122 and the lead frame slots 112 control the insertion depth (z-dimension) of the clip 102 in the lead frame 140, where the insertion depth relates to the amount of pivot of the clip 102. As such, the insertion depth can be dynamically adjusted so that the clip 102 can be pivoted around the lead frame 140 within pre-specified tolerances. Thus, the interlock coupling between the clip forks 122 and the lead frame slots 112 ensures relative positioning between the clip contact 130 and the semiconductor die top side that is within manufacturing specifications regardless of thickness of the semiconductor die or initial placement of the clip 102.

Figure 7:
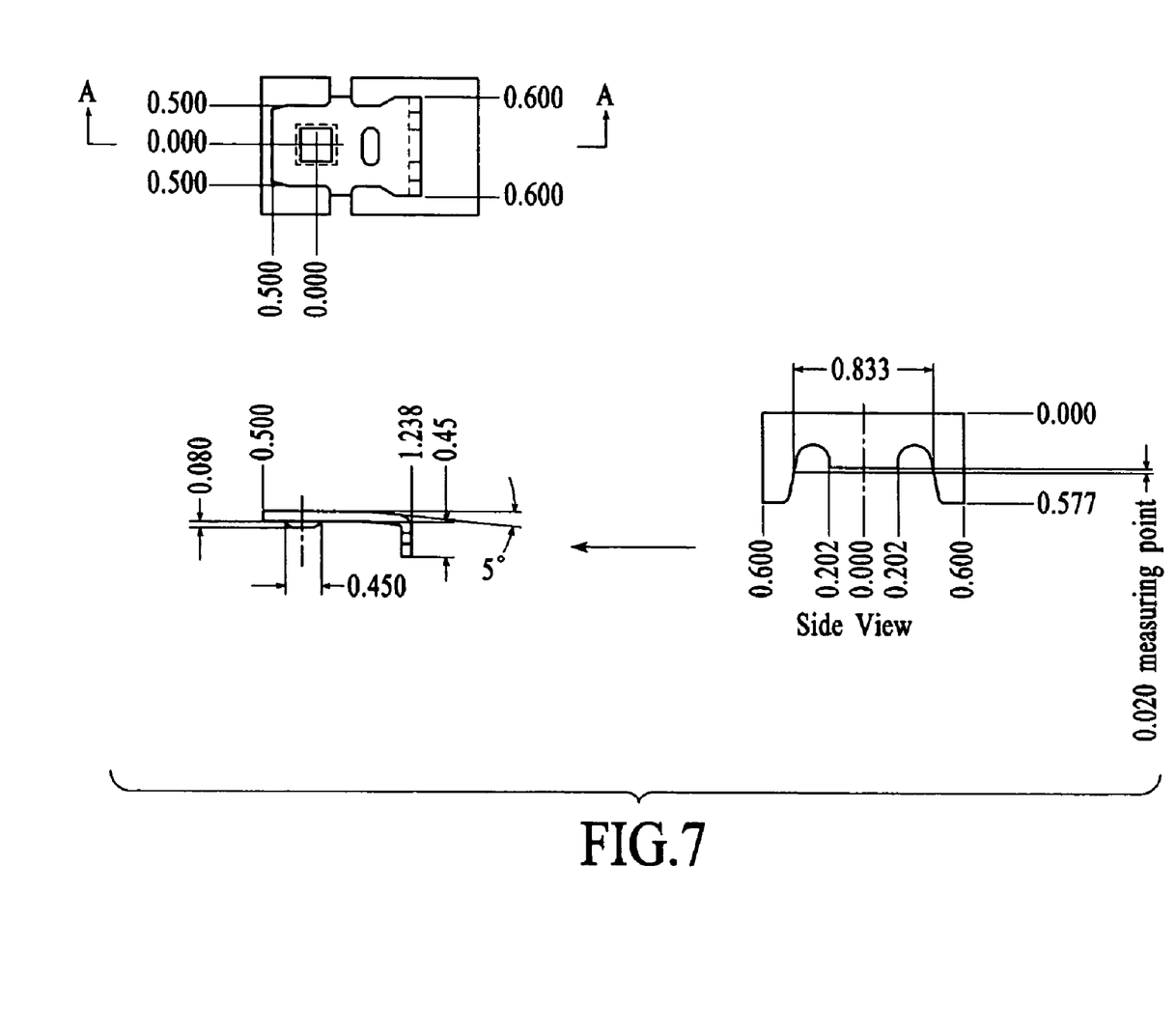
FIG. 7 is a schematic diagram of the single-piece interlocking clip, under the embodiment of FIGS. 1, 2, 4, 5, and 6.

FIG. 7 is a schematic diagram 700 of the single-piece interlocking clip, under the embodiment of FIGS. 1, 2, 4, 5, and 6. This schematic 700 includes dimensions of an example embodiment of the clip and does not limit the clip to the dimensions shown.

Figure 8:
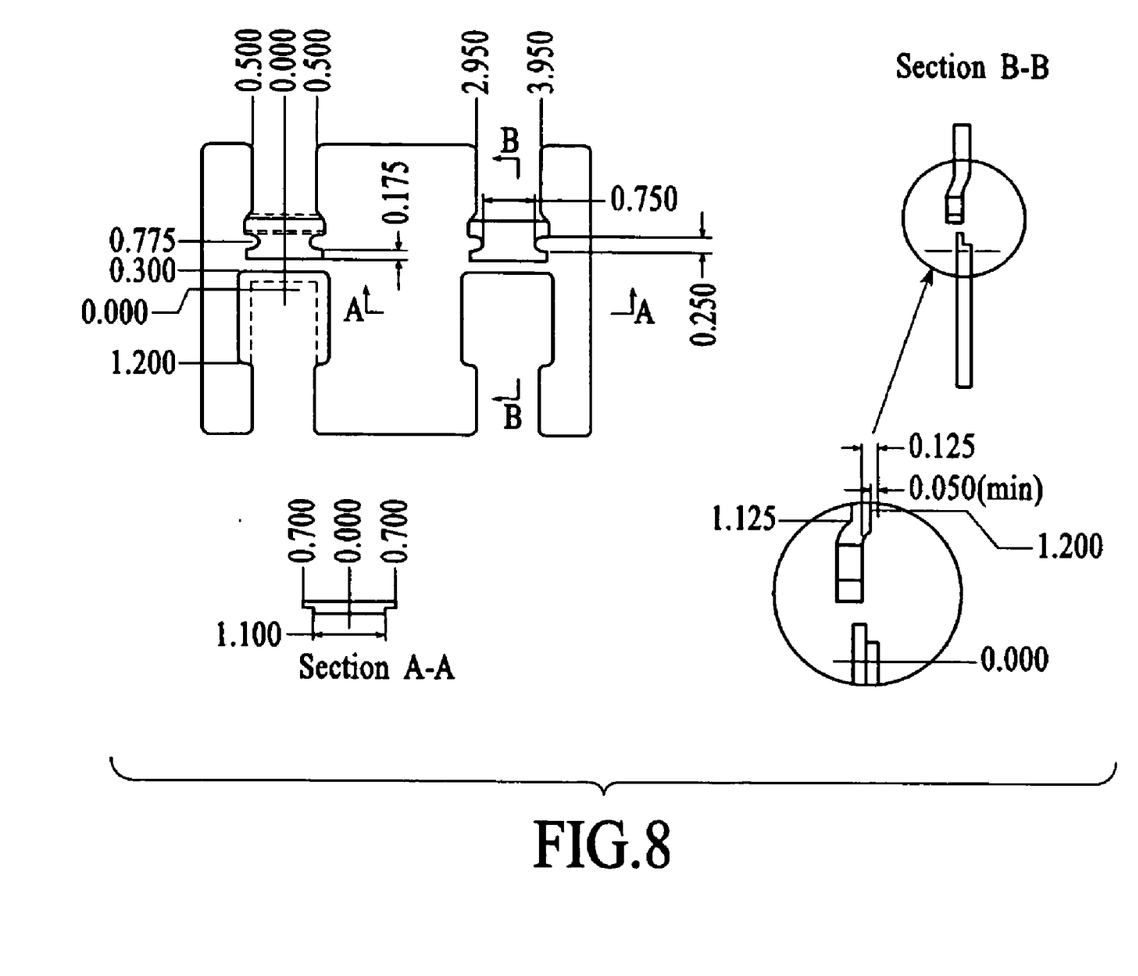
FIG. 8 is a schematic diagram of a lead frame, under the embodiment of FIGS. 1, 2, and 3.

FIG. 8 is a schematic diagram 800 of a lead frame, under the embodiment of FIGS. 1, 2, and 3. This schematic 800 includes dimensions of an example embodiment of the lead frame and does not limit the lead frame to the dimensions shown.

Figure 9:
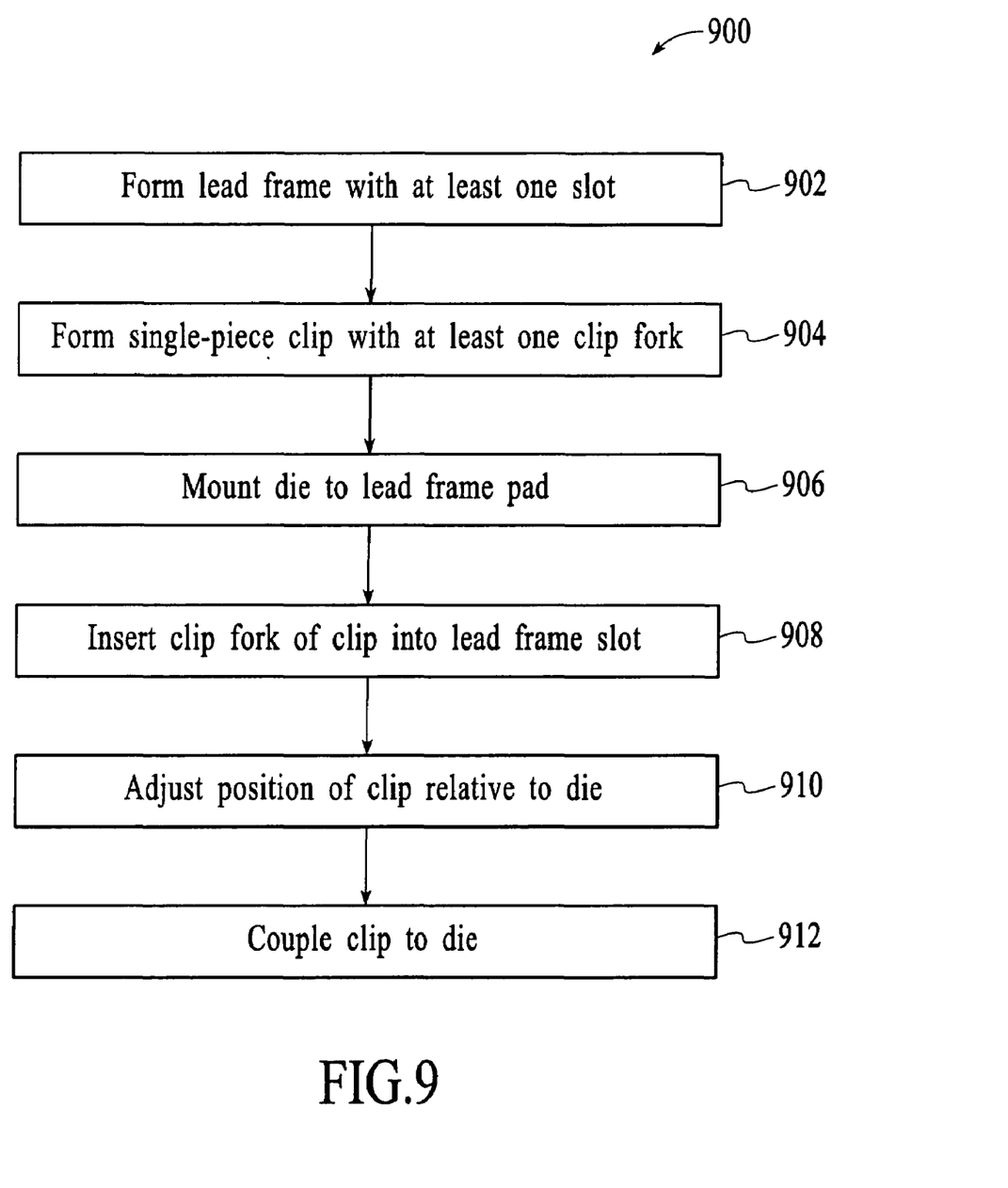
FIG. 9 is a flow diagram for making the semiconductor device having a single-piece interlocking clip, under an embodiment.

FIG. 9 is a flow diagram 900 of a process for making the semiconductor device having a single-piece interlocking clip, under an embodiment. The process begins by forming a lead frame that includes at least one slot on at least one surface, at block 902, and forming a single-piece clip that includes at least one clip fork, at block 904. A first side of a semiconductor die is coupled or mounted to a pad of the lead frame, at block 906. The single-piece clip is coupled to the lead frame by inserting the fork into the slot, at block 908. The process adjusts a position of the clip relative to a position of the semiconductor die, at block 910, by pivoting an end of the clip around at least one pivot point formed by the coupling of the fork and slot. The end of the clip is coupled to an electrical contact of the semiconductor die, at block 912.

Figure 10:
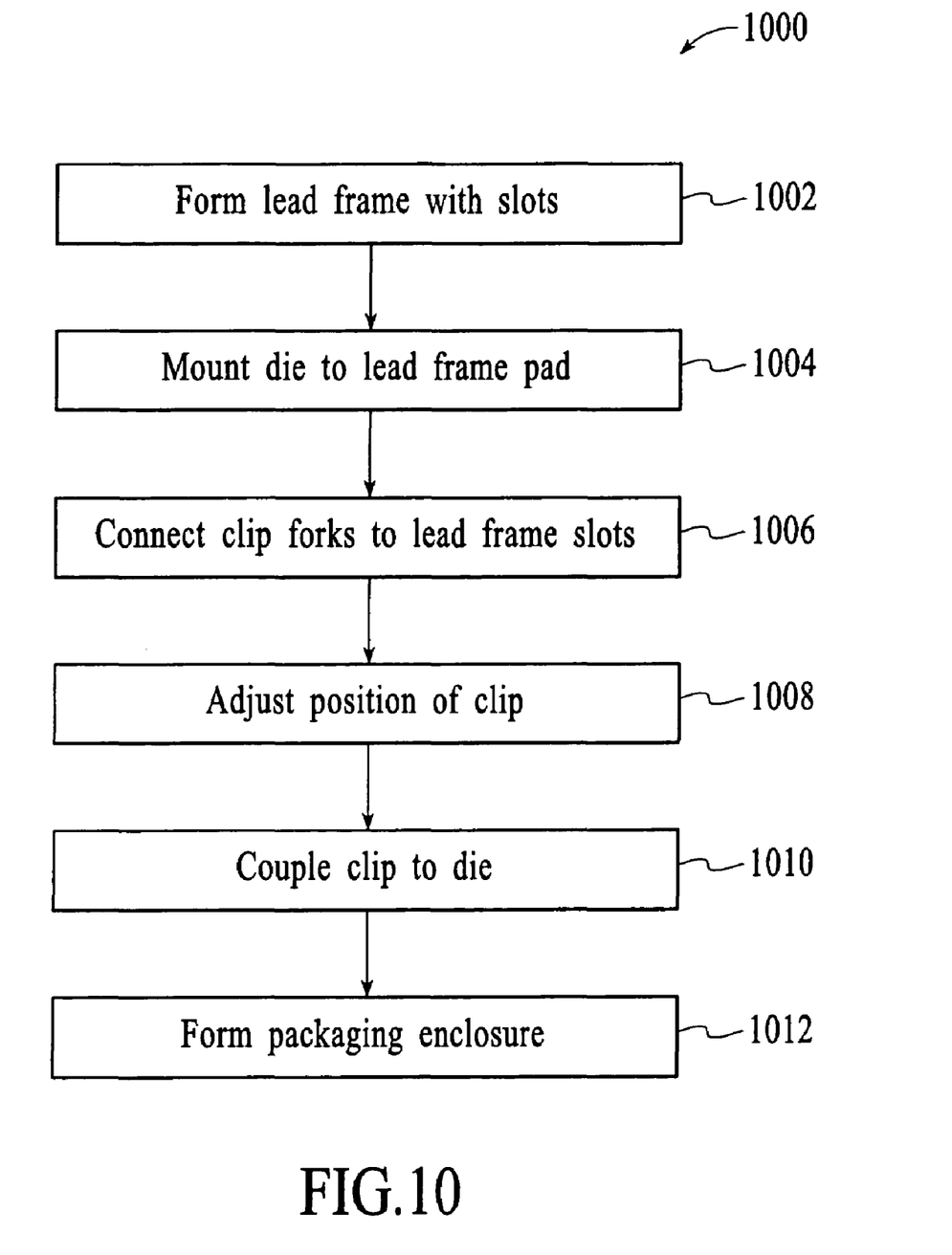
FIG. 10 is a flow diagram for making the semiconductor device having a single-piece interlocking clip, under an alternative embodiment.

FIG. 10 is a flow diagram 1000 of a process for making the semiconductor device having a single-piece interlocking clip, under an alternative embodiment. The process begins by forming a lead frame that includes at least one mounting platform on a first side and two or more opposing slots on each of a second side and a third side, at block 1002. A semiconductor die is mounted on the mounting platform so as to establish a first electrical connection between the semiconductor die and the mounting platform, at block 1004. A clip including two or more opposing forks is connected to the lead frame by inserting the forks into two or more opposing slots of the lead frame, at block 1006. The clip is adjusted relative to a position of the semiconductor die by pivoting a portion of the clip around at least one pivot point formed by the forks and slots in combination, at block 1008. The clip is coupled to an electrical contact of the semiconductor die, at block 1010. A packaging enclosure is formed around the semiconductor structure, at block 1012.

A semiconductor device structure and package is described above that comprises a lead frame, at least one semiconductor die, and at least one clip. The lead frame includes at least one mounting platform on a first side and two or more opposing slots on each of a second side and a third side. The semiconductor die has a first side coupled to the mounting platform.

The clip couples between a conductive lead of the lead frame and a first electrical contact of the semiconductor die. The clip includes two or more opposing forks, wherein each fork is configured to be received by each slot of the lead frame to provide adjustments of a portion of the clip relative to a position of the semiconductor die. The adjustments include pivoting a portion of the clip around at least one pivot point formed by the forks and slots in combination.

Aspects of the semiconductor device with interlocking clip and the methods for making the same are described herein may be implemented as functionality programmed into any of a variety of circuitry, including programmable logic devices (PLDs), such as field programmable gate arrays (FPGAs), programmable array logic (PAL) devices, electrically programmable logic and memory devices and standard cell-based devices, as well as application specific integrated circuits (ASICs). Some other possibilities for implementing aspects of the semiconductor device with interlocking clip and the methods for making the same include: microcontrollers with memory (such as electronically erasable programmable read only memory (EEPROM)), embedded microprocessors, firmware, software, etc. Furthermore, aspects of the semiconductor device with interlocking clip and the methods for making the same may be embodied in microprocessors having software-based circuit emulation, discrete logic (sequential and combinatorial), custom devices, fuzzy (neural) logic, quantum devices, and hybrids of any of the above device types. Of course any underlying device technologies may be provided in a variety of component types, e.g., metal-oxide semiconductor field-effect transistor (MOSFET) technologies like complementary metal-oxide semiconductor (CMOS), bipolar technologies like emitter-coupled logic (ECL), polymer technologies (e.g., silicon-conjugated polymer and metal-conjugated polymer-metal structures), mixed analog and digital, etc.

It should be noted that the various processes and/or devices disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above described processes and/or devices may be processed by a processing entity (e.g., one or more processors) within the computer system in conjunction with execution of one or more other computer programs including, without limitation, netlist generation programs, place and route programs and the like, to generate a representation or image of a physical manifestation of such processes and/or devices. Such representation or image may thereafter be used in semiconductor device fabrication.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The above description of illustrated embodiments of the semiconductor device with interlocking clip and the methods for making the same are not intended to be exhaustive or to limit the processes and/or devices to the precise form disclosed. While specific embodiments of, and examples for, the semiconductor device with interlocking clip and the methods for making the same are described herein for illustrative purposes, various equivalent modifications are possible within the scope of these processes and/or devices, as those skilled in the relevant art will recognize. The teachings of the semiconductor device with interlocking clip and the methods for making the same provided herein can be applied to other processing systems and methods, not only for the systems and methods described above.

The elements and acts of the various embodiments described above can be combined to provide further embodiments. These and other changes can be made to the semiconductor device with interlocking clip and the methods for making the same in light of the above detailed description.

In general, in the following claims, the terms used should not be construed to limit the semiconductor device with interlocking clip and the methods for making the same to the specific embodiments disclosed in the specification and the claims, but should be construed to include all processing systems that operate under the claims. Accordingly, the semiconductor device with interlocking clip and the methods for making the same are not limited by the disclosure, but instead the scope of these processes and/or devices is to be determined entirely by the claims.

While certain aspects of the semiconductor device with interlocking clip and the methods for making the same are presented below in certain claim forms, the inventors contemplate the various aspects of these processes and/or devices in any number of claim forms. Accordingly, the inventors reserve the right to add additional claims after filing the application to pursue such additional claim forms for other aspects of the semiconductor device with interlocking clip and the methods for making the same.

What is claimed is:

1. A semiconductor device comprising:
   a lead ftarne that includes at least one slot on at least one surface;
   a semiconductor die having a first side tat couples to a mounting pad of the lead frame; and
   a single-piece clip that includes at least one clip fork that couples to the slot using an interlock coupling to form a lever, wherein a position of a single-piece clip is adjustable relative to a second side of the semiconductor die.

2. The device of claim 1, wherein a first region of the clip couples to the semiconductor die and a second region of the clip includes the clip fork, wherein the first region of the clip has an orientation that is approximately normal to the second region of the clip.

3. The device of claim 1, wherein the at least one slot on at least one surface includes a first slot in a first surface of the lead frame and a second slot in a second surface of the lead frame.

4. The device of claim 3, wherein the first surface nearly opposes the second surface.

5. The device of claim 1, wherein the clip fork has at least one dimension that tapers relative to a distance from an end of the clip fork that couples to the slot.

6. The device of claim 1, wherein the coupling between the clip fork and the slot corresponding to the clip fork confines motion of the clip in each of a first dimension and a second dimension relative to a position of the lead frame.

7. The device of claim 1, wherein interference between the clip fork and a slot corresponding to the clip fork confines motion of the clip in a third dimension, wherein pivot of the clip relative to a position of the semiconductor die is confined.

8. A semiconductor device comprising:
   a lead frame that includes a, conductive mounting pad and a conductive lead, wherein the conductive lead includes at least one slot on each of a first side and a second side; and
   a clip that includes a plurality of clip forks in a first region, wherein each clip fork is configured to couple to the slot.

9. The device of claim 8, further comprising a semiconductor die including:
   a bottom side that couples to the conductive mounting pad; and
   a top side that couples to the conductive lead of the lead frame using a coupling with a second region of the clip.

10. The device of claim 9, wherein the first region of the clip has an orientation that is approximately normal to the second region of the clip.

11. The device of claim 8, wherein the at least one slot includes a first slot on the first side of the conductive lead and a second slot on the second side of the conductive lead, wherein a position of the first slot opposes a position of the second slot.

12. The device of claim 8, wherein each clip fork has a width that increases in proportion to a distance from an end of the clip fork that couples to the slot that corresponds to the clip fork.

13. The device of claim 8, wherein the coupling between each clip fork and the slot corresponding to the clip fork is an interlocking coupling that confines motion of the clip in each of a first dimension and a second dimension relative to a position of the conductive mounting pad.

14. The device of claim 13, wherein interference between each clip fork and a slot corresponding to the clip fork confines motion of the clip in a third dimension, wherein pivot of the clip relative to a position of the conductive mounting pad is confined.

* * * * *